United States Patent
Rupp

(10) Patent No.: US 8,218,296 B2
(45) Date of Patent: Jul. 10, 2012

(54) HOUSING FOR AN ELECTRONIC DEVICE AND SEALING RING FOR A HOUSING

(75) Inventor: Armin Rupp, Weil am Rhein (DE)

(73) Assignee: Endress + Hauser GmbH + Co. KG, Maulberg (DE)

( * ) Notice: Subject to any disclaimer, the term of this patent is extended or adjusted under 35 U.S.C. 154(b) by 822 days.

(21) Appl. No.: 11/886,661

(22) PCT Filed: Mar. 14, 2006

(86) PCT No.: PCT/EP2006/060711
§ 371 (c)(1),
(2), (4) Date: Dec. 16, 2008

(87) PCT Pub. No.: WO2006/100197
PCT Pub. Date: Sep. 28, 2006

(65) Prior Publication Data
US 2009/0109607 A1 Apr. 30, 2009

(30) Foreign Application Priority Data
Mar. 24, 2005 (DE) .......................... 10 2005 014 297

(51) Int. Cl.
*H05K 5/06* (2006.01)
(52) U.S. Cl. ................... 361/679.01; 277/628; 277/648; 429/172; 257/788; 257/791
(58) Field of Classification Search .................. 257/628, 257/788, 791; 277/628, 648; 361/679.01; 429/172
See application file for complete search history.

(56) References Cited

U.S. PATENT DOCUMENTS

| 3,286,868 A | | 11/1966 | Mumford |
| 5,699,930 A | * | 12/1997 | Channell et al. ............ 220/62.19 |
| 6,296,907 B1 | | 10/2001 | Viksne |
| 6,360,908 B1 | * | 3/2002 | Kline .......................... 220/257.1 |
| 2004/0041347 A1 | * | 3/2004 | Beach et al. .................. 277/314 |

FOREIGN PATENT DOCUMENTS

| DE | 223876 | 10/1962 |
| DE | 39 25 269 A1 | 2/1991 |
| DE | G 92 06 130.3 | 8/1992 |
| DE | 195 28 379 C1 | 10/1996 |
| DE | 198 51 238 A1 | 5/2000 |
| DE | 699 06 939 T2 | 12/2003 |
| EP | 0 837 002 A1 | 4/1998 |
| EP | 1 099 892 A1 | 5/2001 |
| EP | 1 510 736 A1 | 3/2005 |

* cited by examiner

*Primary Examiner* — Junghwa M Im
(74) *Attorney, Agent, or Firm* — Bacon & Thomas, PLLC

(57) ABSTRACT

A housing comprises a first housing part, having a first bearing surface for a first contact surface of a sealing ring, and a second housing part, which can be screwed together with the first housing part and has a second bearing surface for a second contact surface of the sealing ring. The first contact surface of the sealing ring is produced from a first material having a first coefficient of friction in relation to the material of the first bearing surface, the second contact surface of the sealing ring is produced from a second material that has a second coefficient of friction in relation to the material of the second bearing surface, and the first coefficient of friction is smaller than the second coefficient of friction.

4 Claims, 1 Drawing Sheet

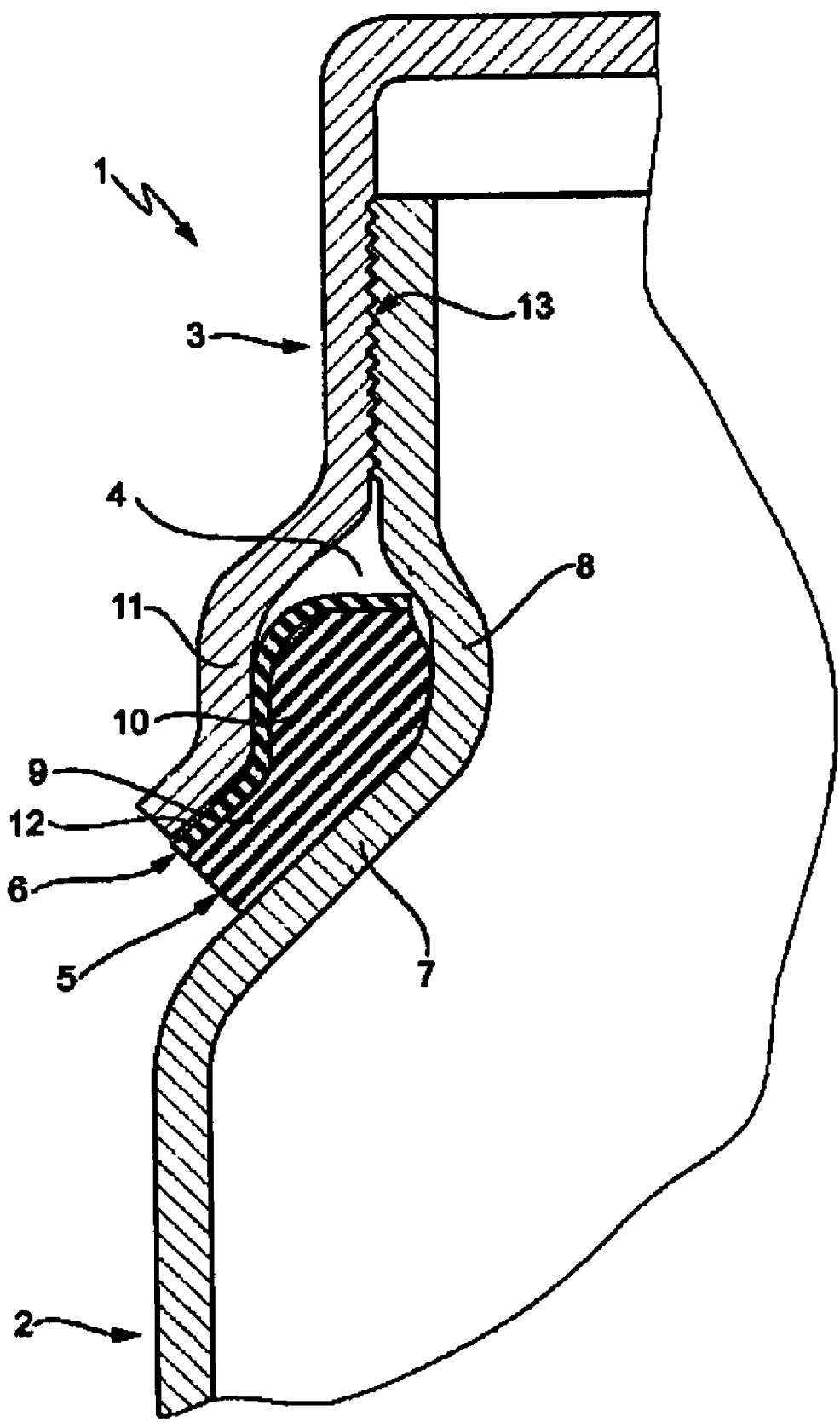

HOUSING FOR AN ELECTRONIC DEVICE AND SEALING RING FOR A HOUSING

TECHNICAL FIELD

The present invention relates to a housing for an electronic device, especially a two-part housing having a screw- or plug-connection between a first housing part and a second housing part.

BACKGROUND DISCUSSION

Such housings are used, for example, in process instrumentation, with stainless steel housings being suitable especially for use in harsh environments. Such stainless steel housings can be manufactured by deep drawing. In such case, it proves to be difficult to provide a reliable seal between the first housing part and the second housing part and yet keep available the option of a simple opening of the housing. Lubricants on the sealing surfaces, also with possibly provided sealing rings, do assure, at least at first, the requisite moveability of the housing parts relative to one another, but, already after a comparatively short period of time, the opening of the screw- or plug-connection between the two housing parts becomes difficult, since they dry out or in other respects change their characteristics. The reliable use of sealing rings is, moreover, problematic, because a reliable sealing seat, which keeps a sealing ring in position despite the arising shear forces during the connecting of the housing parts, can only be implemented with much difficulty, especially when dealing with deep drawn housings.

SUMMARY OF THE INVENTION

It is, therefore, an object of the present invention to provide a housing which overcomes the described disadvantages of the state of the art.

The object is achieved according to the invention by a housing including
a first housing part, which has a first bearing surface for a first contact surface of a sealing ring; and
a second housing part, which is connectable with the first housing part and which has a second bearing surface for a second contact surface of the sealing ring,
wherein the first contact surface of the sealing ring has a first material, which has a first coefficient of friction relative to the material of the first bearing surface, the second contact surface has a second material, which has a second coefficient of friction relative to the material of the second bearing surface, and the first coefficient of friction is smaller than the second coefficient of friction.

The sealing ring of the invention includes, accordingly, a first contact surface for bearing on a first bearing surface, with the first contact surface having a first material with a first coefficient of friction for the material of the first bearing surface; and a second contact surface for bearing on a second bearing surface, wherein the second contact surface has a second material with a second coefficient of friction for the material of the second bearing surface, and the first coefficient of friction is smaller than the second coefficient of friction.

The above condition is preferably also fulfilled when the surface roughness of the material of the first bearing surface equals the surface roughness of the material of the second bearing surface, respectively when the material of the first bearing surface is the same as the material of the second bearing surface.

In a preferred embodiment, the first coefficient of friction is smaller than the second coefficient of friction to such a degree that in the case of a screwing of the first housing part into connection with the second housing part, the first bearing surface can slide over the first contact surface, while the second contact surface executes at most negligible relative movements with reference to the second bearing surface.

In a currently preferred embodiment of the invention, the sealing ring includes an elastic foundation, especially one of an elastomer, for example a silicone polymer or silicone rubber or EPDM, and a partial coating of a material having a lesser coefficient of friction, for example a PTFE. The partial coating can, for example, be prepared as a separate component and subsequently adhered or vulcanized to the foundation. Equally, the partial coating can be applied to the foundation from a liquid or by gas phase deposition. Regions not to be coated are appropriately masked off.

The material of the first and/or second housing part can comprise a metal, especially stainless steel. The connection between the first housing part and the second housing part can be, for example, a screw connection or a plug connection, or another type of connection, in the case of which the first housing part slides in contact over the first contact surface of the sealing ring.

BRIEF DESCRIPTION OF THE DRAWINGS

The invention will now be explained on the basis of an example of an embodiment presented in the drawing, the FIGURE of which show as follows:

FIG. 1 a detail view of a section through a housing of the invention.

DETAILED DISCUSSION

The housing 1, of which a detail is presented in FIG. 1, includes a housing body 2 and a housing lid 3, which are releasably connected together. For example, they are screwed together. The housing body and the housing lid are made of stainless steel in a deep drawing process, with V4A stainless steel currently being preferred as material. Clamped between the housing body 2 and the housing lid 3 is a sealing ring 4. Sealing ring 4 includes a foundation 5 of an elastomer, especially a silicone, as well as a PTFE layer 6, which is vulcanized onto the foundation. In such case, only a part of the surface of the foundation is covered with the PTFE layer, and, indeed, in such a manner that the surface of the sealing ring 4 contacting the housing lid 3 is of PTFE and the surface of the sealing ring 4 contacting the housing body 2 is of silicone. The described embodiment of the sealing ring effects that, in the screwing of the housing lid 3 onto the housing body 2, the housing lid slides over the sealing ring and preferably, at most, transfers negligible shear forces into the sealing ring 4, while the sealing ring scarcely changes its position relative to the housing body 2.

The sealing action is achieved in the illustrated form of embodiment essentially by a radial compression of the sealing ring 4 between the housing lid 3 and the housing body 2.

The sealing seat of the housing body 2 comprises a slight radial necking 8 in the lateral surface of the housing body pressed or necked into the lateral surface, with a truncated conical widening 7 following on the radial necking. The sealing ring 4 is axially supported on the widening 7, in order, in the case of screwing of the housing lid onto the housing body, to prevent axial shifting of the sealing ring 4 on the housing body. The truncated conical widening has, for example, a vertex angle relative to the housing axis of the not less than 30° and not more than 45°.

The foundation 5 of the sealing ring 4 has a contour matched to that of the sealing seat. Thus, the foundation 5 has a sealing section 10 and a support section 9 following thereon, with the support section 9 bearing at least sectionally on the truncated conical widening 7, and the sealing section 10 bearing at least sectionally on the radial necking 8.

Housing lid 3 has, in the region of the seal, a contour complementary to that of the housing body 2, respectively the sealing ring 4. The housing lid exhibits a compression section 11, which is axially so positioned that it is aligned axially with the radial necking 8 of the housing body 2, respectively with the sealing section 10 of the sealing ring 4, when the housing lid is screwed onto the housing body. The radial separation of the compression section 11 from the radial necking 8 is so matched to the sealing ring 4 that the radial compression of the sealing ring 4 assures a sufficient sealing.

The housing lid includes, furthermore, a truncated conical cover section 12, which follows on the compression section 11 and covers the support section 9 of the sealing ring 4. The inner surface of the cover section 12 lies preferably on the support section 9, in order, on the one hand, to protect such, and, on the other hand, to avoid gaps or dead spaces, in which contaminants could deposit. Compression for achieving a sealing action in the region of the support section can, in most circumstances, be omitted. In this way, it is possible to avoid an axial component of the compression which might favor an unintended opening of the housing. This is especially relevant when the closure thread 13 between the housing body 2 and the housing lid 3 has a large pitch, such as is usual in the case of deep drawn housings.

The invention claimed is:

1. A housing, comprising:
   a sealing ring, having a first contact surface and a second contact surface;
   a first housing part, which has a first bearing surface for said first contact surface of said sealing ring; and
   a second housing part, which is connectable with said first housing part and has a second bearing surface for said second contact surface of said sealing ring, wherein:
   the material of said first housing part and said second housing part comprises stainless steel;
   said first housing part and said second housing part are made in a deep drawing process;
   said first contact surface has a first material with a first coefficient of friction relative to the material of said first bearing surface, said second contact surface has a second material with a second coefficient of friction relative to the material of said second bearing surface, and said first coefficient of friction is smaller than said second coefficient of friction;
   said first housing part is connectable with said second housing part via a connection in the form of a screw connection, in the case of which is the making or the releasing of the connection, said housing part slides in contact over said first contact surface of said sealing ring;
   said sealing ring comprises an elastic foundation, of the elastomer, and a partial coating of
   said partial coating is adhered to the foundation, or vulcanized thereto; and
   said elastomer comprises a silicone polymer or ethylene propylene diene monomer (EPDM).

2. The housing as claimed in claim 1, wherein:
   said first coefficient of friction is smaller than said second coefficient of friction to such a degree that, in the case of screwing of said first housing part onto said second housing part, said first bearing surface can slide over said first contact surface, while said second contact surface executes at most negligible relative movements with respect to said second bearing surface.

3. The housing as claimed in claim 1, wherein:
   said partial coating is adhered to the foundation, or vulcanized thereto;
   the material of said first and/or second housing part comprises a metal, especially stainless steel; and
   said first housing part is connectable with said second housing part via a connection in the form of one of:
   a screw connection, a plug connection, and another type of connection, in the case of which, in the making or releasing of the connection, said first housing part slides in contact over said first contact surface of the sealing ring.

4. The housing as claimed in claim 1, wherein:
   the partial coating is PTFE.

* * * * *